US008373505B2

(12) United States Patent
Cozzolino

(10) Patent No.: US 8,373,505 B2
(45) Date of Patent: Feb. 12, 2013

(54) DYNAMIC CURRENT BOOST IN CLASS AB AMPLIFIER FOR LOW DISTORTION

(75) Inventor: Carmine Cozzolino, Encinitas, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/028,302

(22) Filed: Feb. 16, 2011

(65) Prior Publication Data

US 2012/0206203 A1 Aug. 16, 2012

(51) Int. Cl.
*H03F 3/26* (2006.01)
(52) U.S. Cl. .......................... 330/267; 330/279
(58) Field of Classification Search .................. 330/267, 330/279, 254, 278
See application file for complete search history.

(56) References Cited

U.S. PATENT DOCUMENTS

| 7,595,692 B2 * | 9/2009 | Ishida ........................... 330/279 |
| 7,595,694 B2 * | 9/2009 | Takahashi et al. .............. 330/285 |
| 7,782,138 B2 * | 8/2010 | Dally et al. .................... 330/279 |
| 7,982,541 B2 * | 7/2011 | Nakai et al. .................... 330/279 |

FOREIGN PATENT DOCUMENTS

KR 102012009445 8/2012

OTHER PUBLICATIONS

Fairchild Semiconductor Corp, "Advance Information, FAB1200 Ground Referenced Class G Headphone Amplifier with Integrated Buck Converter", www.fairchildsemi.com, (Sep. 2009), 16 pgs.
Gai, W., et al., "Quadratic-translinear CMOS multiplier-divider circuit", Electronics Letters, 33(10), (1997), 860-861.
Monticelli, D. M, "A quad CMOS single-supply op amp with rail-to-rail output swing", IEEE Journal of Solid-State Circuits, 21(6), (1986), 1026-1034.
"Chinese Application Serial No. 201220068921.8, Response filed Sep. 12, 2012 to Office Action mailed Jul. 7, 2012", 17 pgs.

* cited by examiner

*Primary Examiner* — Henry Choe
(74) *Attorney, Agent, or Firm* — Schwegman, Lundberg & Woessner, P.A.

(57) ABSTRACT

An apparatus comprises an amplifier circuit and a detection circuit. The amplifier circuit includes a high voltage supply rail, a low voltage supply rail, and an output stage. The detection circuit is electrically coupled to the amplifier output stage and generates an indication when the output voltage at the output stage exceeds a specified output voltage threshold value. The amplifier circuit further includes a bias circuit configured to bias the amplifier circuit with a first bias current value when the output voltage is less than the specified output voltage threshold value, and bias the amplifier circuit with a second bias current value when the output voltage exceeds the specified output voltage threshold value.

18 Claims, 4 Drawing Sheets

DYNAMIC CURRENT BOOST IN CLASS AB AMPLIFIER FOR LOW DISTORTION

BACKGROUND

Personal electronic devices include MP3 portable media players, cellular phones, and smart phones. Convenience of the devices stems in part from the functionality they provide despite their small size. Because the devices are battery powered, there can be a design tradeoff between size and the amount of operating time before batteries need to be replaced. It is desirable to continue to provide more functionality in such devices even though it is desired to keep the devices at their same small size or to make them even smaller.

Overview

This document relates generally to electronic switches and methods of their implementation. An apparatus example includes an amplifier circuit and a detection circuit. The amplifier circuit includes a high voltage supply rail, a low voltage supply rail, and an output stage. The detection circuit is electrically coupled to the amplifier output stage and generates an indication when the output voltage at the output stage exceeds a specified output voltage threshold value. The amplifier circuit further includes a bias circuit configured to bias the amplifier circuit with a first bias current value when the output voltage is less than the specified output voltage threshold value, and bias the amplifier circuit with a second bias current value when the output voltage exceeds the specified output voltage threshold value.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This document relates generally to electronic amplifiers and in particular to reducing the energy requirements for operating an amplifier. Amplifiers can be used to drive a low impedance load (e.g., a set of headphones for a personal electronic device). There can be a design tradeoff between providing enough power in the amplifier to drive the load with a minimum of distortion and minimizing the amount of power required to operate the amplifier.

Figure 1:
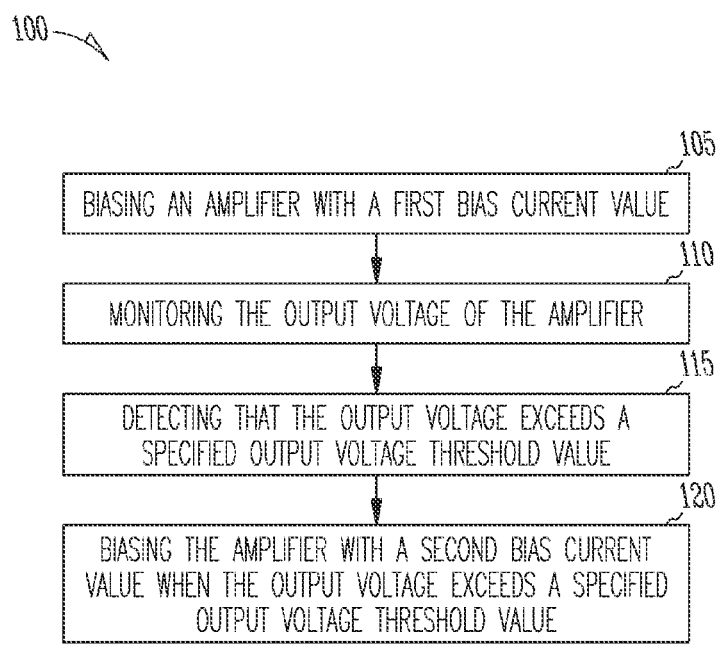
FIG. 1 is a flow diagram of an example of a method of implementing an amplifier.

FIG. 1 is a flow diagram of an example of a method 100 of implementing an amplifier to minimize consumption of energy and yet minimize signal distortion at the amplifier output. At block 105, the amplifier is biased with a first bias current value. The bias current can be used to set the operating region of one or more transistors in the amplifier.

At block 110, the output voltage of the amplifier is monitored. At block 115, when it is detected that the output voltage exceeds a specified output voltage threshold value, the amplifier is biased with a second bias current value when the output voltage exceeds a specified output voltage threshold value. Hence, the second bias current can be greater than the first, or quiescent, bias current to provide increased drive.

The increased drive reduces distortion at the load being driven by the amplifier. The increased drive current is provided when required by what is happening at the load, and normally is in a state of lower power consumption. Thus, enough power is provided by the amplifier to drive the load with a minimum of distortion, and energy used by the amplifier is reduced when this power is not required by the output stage.

Figure 2:
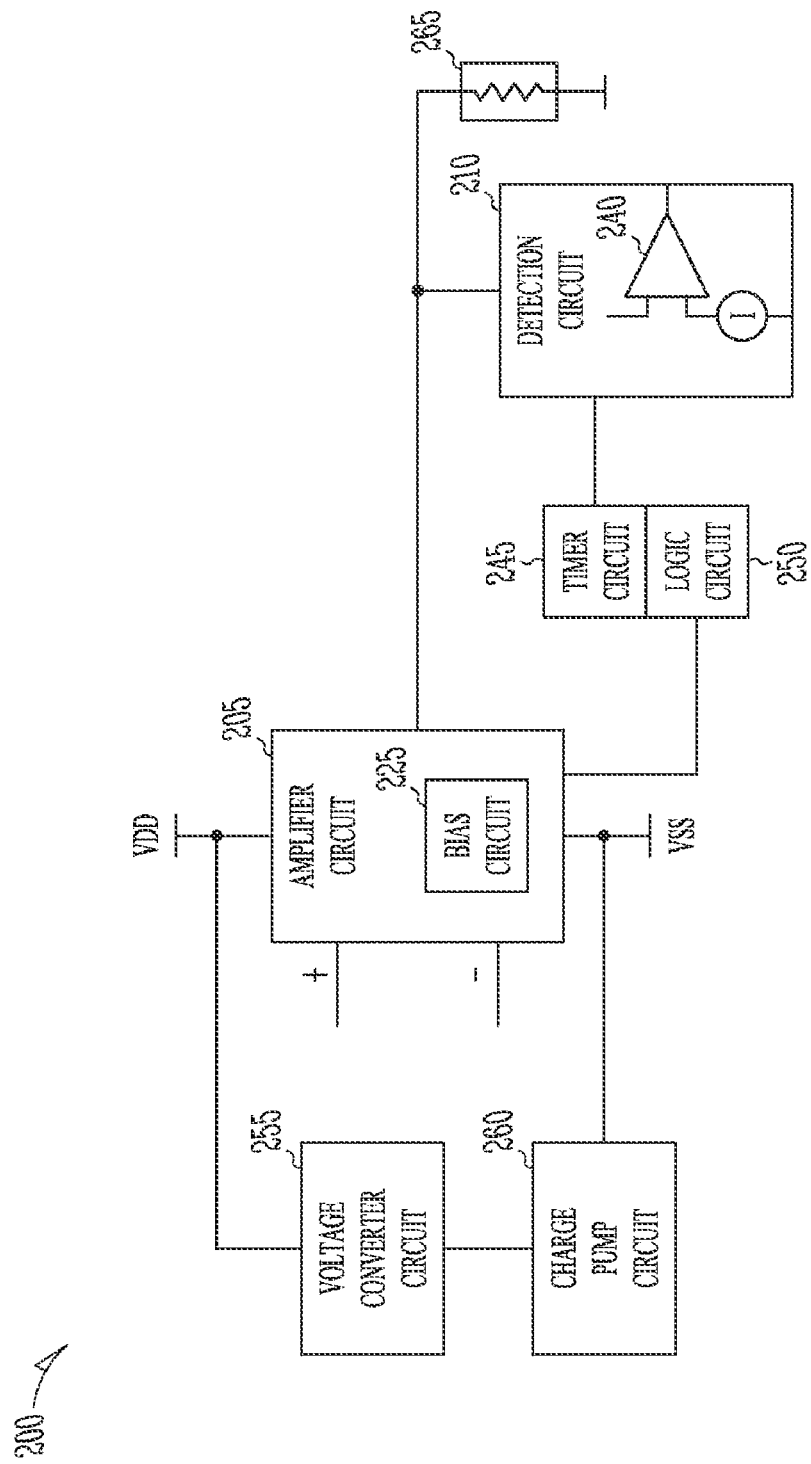
FIG. 2 is a block diagram of a device that provides an amplifier having a dynamic current boost.

FIG. 2 is a block diagram of a device 200 that provides an amplifier having a dynamic current boost. The device 200 includes an amplifier circuit 205 and a detection circuit 210. The detection circuit 210 can be electrically coupled to an output stage of the amplifier circuit 205. The detection circuit 210 generates an indication (e.g., a signal or a change in logic level) when the output voltage at the output stage exceeds a specified output voltage threshold value.

Figure 3:
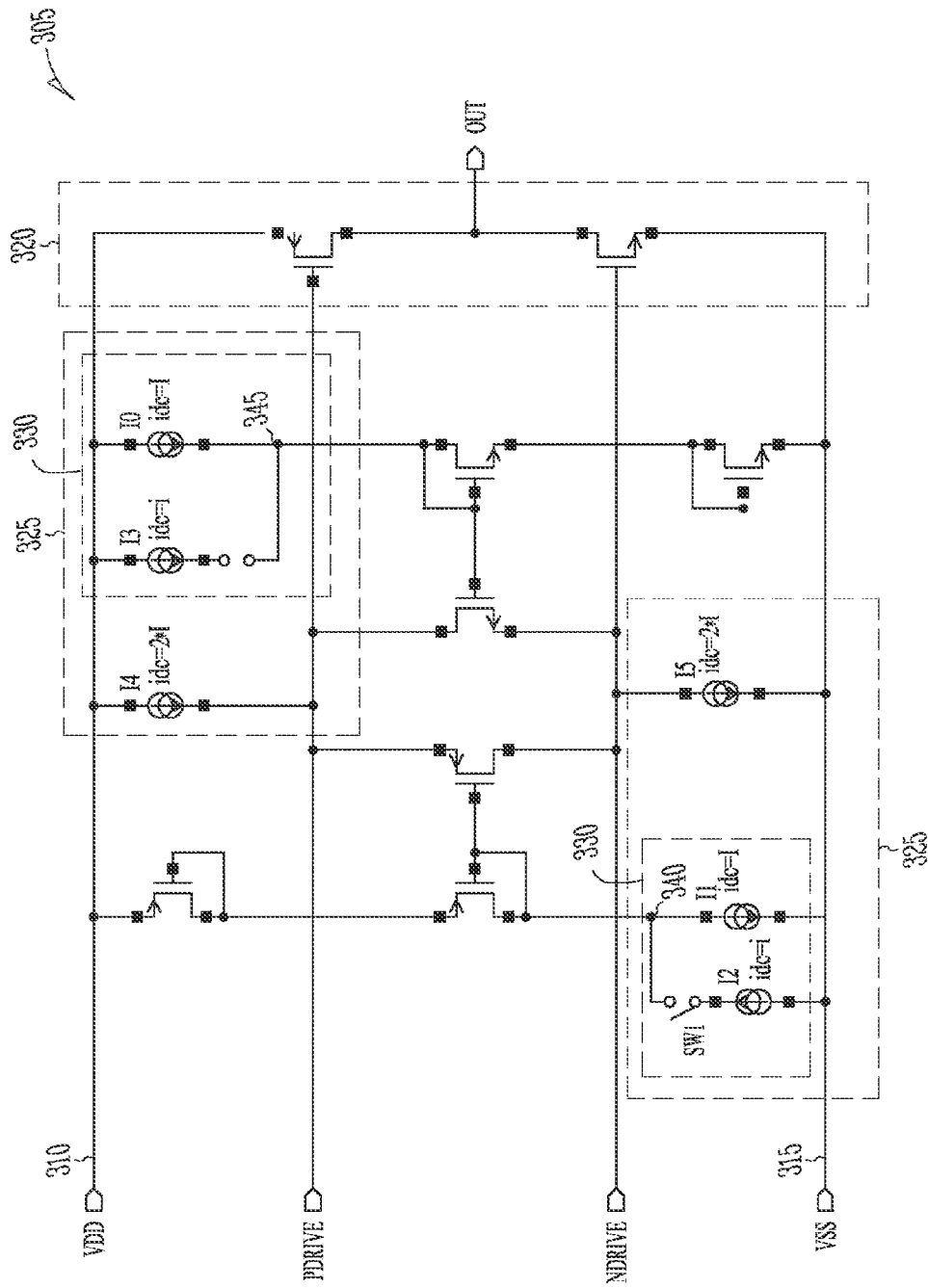
FIG. 3 is a schematic of portions of an example of an amplifier circuit.

FIG. 3 is a schematic of portions of an example of an amplifier circuit 305. The amplifier circuit 305 includes a high voltage supply rail 310, a low voltage supply rail 315, and an output stage 320. The amplifier circuit 305 also includes at least one bias circuit 325. The bias circuit 325 provides bias current to set the gain and frequency response of the amplifier circuit 305. The bias current sets the transconductance ($g_m$) of the output devices and sets the open loop gain of the amplifier circuit 305.

The bias circuit 325 is able to bias the amplifier circuit 305 with multiple bias currents. In some examples, the bias circuit 325 includes a current reference circuit 330 and a current mirror circuit. The current mirror circuit mirrors a multiple of the referenced current as the bias current. Typically, the bias circuit 325 provides a first or quiescent bias current to the output stage as a mirrored current. The bias circuit 325 may change (e.g., increase) the multiple of the referenced current to generate a second bias current. For example, the current reference circuit 330 may include two current sinks (or current sources). When switch SW1 and/or SW2 is closed, additional current is mirrored to the output stage.

Changing the bias current effectively re-biases the amplifier circuit to change the amplifier gain. If the second bias current value is greater than the first bias current value, the quiescent output stage current is increased, the $g_m$ of the output devices is increased, and consequently the open loop gain of the amplifier is increased. Because the output stage 320 has increased bias current, increasing the current of the bias circuit 325 results in lower distortion seen at a load driven by the amplifier circuit 305.

Thus, the amplifier circuit 305 can be viewed as having a higher distortion mode when biased with the first bias current, and lower distortion mode when biased with the second bias current. In some examples, the mode is selectable by a user. The device 200 in FIG. 2 may include a memory element such as a flip-flop circuit or a control register. Programming the memory element can enable or disable a switch to change the amount of bias current.

The bias circuit 225 biases the amplifier circuit 205 with a first bias current value when the output voltage is less than the specified output voltage threshold value, and biases the amplifier circuit with a second bias current value when the output voltage exceeds the specified output voltage threshold value. In some examples, the detection circuit 210 includes a comparator circuit 240 that provides the indication when the output voltage exceeds a specified reference voltage. The reference voltage can be set to an arbitrary switch point as desired (e.g., a set voltage or a percentage of the maximum voltage swing).

As stated previously in regard to FIG. 3, the bias circuit 325 may increase the multiple of the referenced current in the output stage 320 to generate the second bias current. One way to increase the multiple of the referenced current is to increase the referenced current. For example, the current reference circuit 330 may include a plurality of current references including at least a first current reference and a second current reference. The current references may include current sinks and/or current sources as shown in FIG. 3.

The current reference circuit 330 provides a first reference current at a circuit node 340 and/or circuit node 345 of the amplifier circuit 305 to provide the first bias current when the output voltage is less than the specified output voltage threshold value. The current reference circuit 330 switches (e.g., by activating switches SW1 and SW2) a second current reference to the circuit node of the amplifier circuit to generate the second bias current when the output voltage exceeds the specified output voltage threshold value. This provides additional bias current to the output stage.

Another way to increase the bias current is change the ratio of the mirrored current. Current is mirrored according to dimensions of transistors in a current mirror circuit. Changing the effective dimensions of a transistor can change the ratio of the mirrored current.

Figure 4:
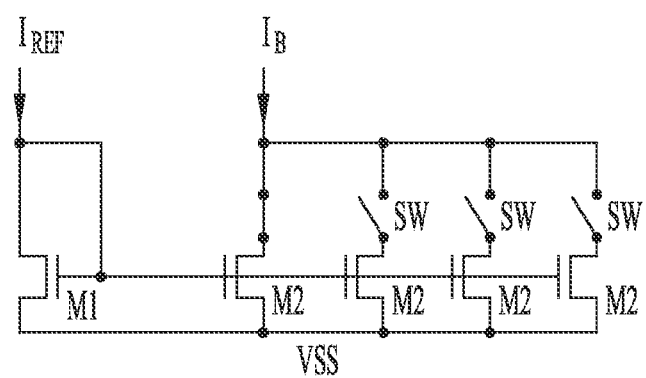
FIG. 4 shows an example of a current mirror circuit.

FIG. 4 shows an example of a current mirror circuit. The current mirror circuit includes a plurality of transistors. Reference current $I_{REF}$ is applied to transistor M1. Transistor M2 mirrors the current in M1 to set the bias current $I_B$. The current in M2 is mirrored according to the ratio of the dimensions of M2 and M1. Changing the dimensions of one of the transistors changes the mirrored current. In the example shown, closing one or more of the switches SW adds transistors to effectively change the dimensions of transistor M2, which changes the ratio of the current mirror.

According to some examples, the bias current can be adjusted to a variety of bias current values. Returning to FIG. 2, the bias circuit 225 can increase the multiple of the referenced current in the output stage in proportion to a measured output voltage at the output stage. The result is a bias current that can be adjusted more continuously rather than in a discrete step. In certain examples, the detection circuit 210 includes an analog to digital converter (ADC) circuit. A digital value converted from an output voltage level can be used (e.g., as a decoder) to enable one or more of the plurality of transistors to generate the bias current.

If the output voltage hovers around the switching point, the bias current may repeatedly switch between the first bias current value and the second bias current value. To avoid such switching, when the second bias current value is enabled, it may stay enabled for a specified (e.g., programmed) period of time. In some examples, the device 200 includes a timer circuit 245 and a logic circuit 250 electrically coupled to the detection circuit 210. The timer circuit 245 times a specified time duration when receiving the indication from the detection circuit 210 that the output voltage exceeds the threshold. The logic circuit 250 enables biasing of the amplifier circuit 205 with the second bias current during the timing of the specified time duration. At the end of the time duration, if the output voltage of the amplifier circuit 205 is less than specified output voltage threshold value, the logic circuit enables biasing of the amplifier circuit with the first bias current. If the output voltage of the amplifier circuit 205 still exceeds the specified output voltage threshold value at the end of the duration, the logic circuit 250 restarts (e.g., resets) the timer circuit 245 to again time the specified time duration, and enables or re-enables biasing of the amplifier circuit 205 with the second bias current.

Another method to avoid switching when the output voltage hovers around the switching point is to implement hysteresis around the switching point voltage. For instance, the amplifier circuit 205 can be biased with the second bias current value when the output voltage exceeds a first specified output voltage threshold value. The amplifier circuit 205 is biased with the first bias current value when the output voltage becomes less than a second specified output voltage threshold value. The second specified output voltage threshold value is less than the first specified output voltage threshold value. Thus, the tripping point from switching to the increased bias current is higher than the tripping point for returning to the quiescent bias point.

Still another method to avoid the switching is to combine hysteresis with the switching by timed duration. For instance, the timer circuit 245 begins timing the specified time duration when the output voltage exceeds the first specified output voltage threshold value, and the logic circuit 250 enables biasing of the amplifier circuit with the second bias current for the specified time duration. To implement hysteresis in the biasing of the amplifier circuit 205, logic circuit 250 enables biasing of the amplifier circuit 205 with the first bias current when the output voltage is less than a second specified output voltage threshold value at the end of the time duration, and restarts the timer circuit to again time the specified time duration and enable biasing of the amplifier circuit with the second bias current when the output voltage exceeds the second specified output voltage threshold value at the end of the time duration.

According to some examples, the amplifier circuit can use multiple voltage supply rails. In some examples, device 200 includes a voltage converter circuit 255 electrically coupled to the high voltage supply rail. The voltage converter circuit 255 generates the high supply voltage and increases the difference between the high supply voltage rail and the low supply voltage rail of the amplifier circuit when the output voltage exceeds the specified output voltage threshold value. This increased difference in the supply rails, as well as the increased bias current, increases the dynamic range of the amplifier circuit 205.

In some examples, the device 200 includes a charge pump circuit 260 electrically coupled to the low voltage supply rail, and the voltage converter circuit 255 includes a voltage boost converter circuit. The charge pump circuit 260 inverts the high supply voltage to generate the low supply voltage. To increase the difference in the supply rails, the voltage converter circuit 255 increases the high supply voltage when the output voltage exceeds the specified output voltage threshold value, and the charge pump circuit inverts the increased high supply voltage to provide an increased magnitude of the low supply voltage.

According to some examples, the amplifier circuit 205 is included in an integrated circuit. In certain examples, the integrated circuit is included in a cellular phone or smart phone. In certain examples, the integrated circuit is included in a personal media player, such as an MP3 (MPEG-2 Audio Layer 3) player for example.

In certain examples, the amplifier circuit 205 is an audio headphone amplifier circuit and the output stage generates an output signal that includes signal frequencies in the audio range. Audio amplifiers are sometimes used to provide power to a low impedance load, such as a transducer or speaker to generate sound for example. In certain examples, the impedance of the load 265 is less than one hundred ohms (100Ω). Increasing the bias current of the amplifier circuit 205 to the second bias current value can reduce harmonic distortion of the output signal at the load 265. In certain examples, the output stage of the amplifier circuit 205 is electrically coupled to an audio jack connector connectable to an audio jack plug.

ADDITIONAL NOTES

Example 1 includes subject matter (such as an apparatus) comprising an amplifier circuit and a detection circuit. The amplifier circuit includes a high voltage supply rail, a low voltage supply rail, and an output stage. The detection circuit is electrically coupled to the amplifier output stage and is configured to generate an indication when an output voltage at the output stage exceeds a specified output voltage threshold value. The amplifier circuit further includes a bias circuit configured to bias the amplifier circuit with a first bias current value when the output voltage is less than the specified output voltage threshold value, and bias the amplifier circuit with a second bias current value when the output voltage exceeds the specified output voltage threshold value.

In Example 2, the bias circuit of Example 1 can optionally include a current reference circuit and a current mirror circuit configured to mirror a multiple of the referenced current in the output stage, and the bias circuit can optionally be configured to increase the multiple of the referenced current in the output stage to generate the second bias current.

In Example 3, the bias circuit of one or any combination of Examples 1 and 2 can optionally be configured to increase the multiple of the referenced current in the output stage in proportion to a measured output voltage at the output stage.

In Example 4, the current mirror circuit of one or any combination of Examples 2 and 3 optionally includes a plurality of transistors including a first transistor to mirror the reference current at a circuit node of the output stage of the amplifier, and the current mirror circuit can optionally be configured to switch one or more additional transistors onto the circuit node to generate the second bias current.

In Example 5, the bias circuit of one or any combination of Examples 1-4 can optionally include a current reference circuit and a current mirror circuit configured to mirror a multiple of the referenced current in the output stage, and the bias circuit can optionally be configured to increase the referenced current to generate the second bias current.

In Example 6, the current reference circuit of Example 5 can optionally include a plurality of circuit references including a first current reference and a second current reference, and wherein the current reference circuit is configured to provide a first reference current at a circuit node of the amplifier circuit to provide the first bias current when the output voltage is less than the specified output voltage threshold value, and switch a second current reference to the circuit node of the amplifier circuit to generate the second bias current when the output voltage exceeds the specified output voltage threshold value.

In Example 7, the subject matter of one or any combination of Examples 1-6 can optionally include a timer circuit and a logic circuit. The timer circuit can be electrically coupled to the detection circuit and configured to time a specified time duration when receiving the indication from the detection circuit. The logic circuit can optionally be configured to enable biasing of the amplifier circuit with the second bias current for the specified time duration, enable biasing of the amplifier circuit with the first bias current when the output voltage is less than the specified output voltage threshold value at the end of the time duration, and reset the timer circuit to again time the specified time duration and enable biasing of the amplifier circuit with the second bias current when the output voltage exceeds the specified output voltage threshold value at the end of the time duration.

In Example 8, the subject matter of one or any combination of Examples 1-6 can optionally include a timer circuit and a logic circuit. The timer circuit electrically can optionally be coupled to the detection circuit, and configured to time a specified time duration when the output voltage exceeds the specified output voltage threshold value, wherein the specified output voltage threshold voltage value is a first specified output voltage threshold value. The logic circuit can optionally be configured to enable biasing of the amplifier circuit with the second bias current for the specified time duration, enable biasing of the amplifier circuit with the first bias current when the output voltage is less than a second specified output voltage threshold value at the end of the time duration, wherein the second specified output voltage threshold value is less than the first specified output voltage threshold value, and reset the timer circuit to again time the specified time duration and enable biasing of the amplifier circuit with the second bias current when the output voltage exceeds the second specified output voltage threshold value at the end of the time duration.

In Example 9, the subject matter of one or any combination of Examples 1-8 can optionally include a voltage converter circuit electrically coupled to the high voltage supply rail and configured to generate the high supply voltage. The voltage converter circuit can optionally be configured to increase a difference between the high supply voltage rail and the low supply voltage rail of the amplifier circuit when the output voltage exceeds a specified output voltage threshold value.

In Example 10, the subject matter of Example 9 can optionally include a charge pump circuit electrically coupled to the low voltage supply. The charge pump circuit can optionally be configured to invert the high supply voltage to generate the low supply voltage, and the voltage converter circuit can optionally be configured to increase the high supply voltage when the output voltage exceeds the specified output voltage threshold value.

In Example 11, the detection circuit of one or any combination of Examples 1-10 can optionally include a comparator circuit configured to provide the indication when the output voltage exceeds a specified reference voltage.

In Example 12, the detection circuit of one or any combination of Examples 1-11 can optionally include a comparator circuit configured to provide the indication when the output voltage exceeds a specified percentage of the voltage difference between the high voltage supply rail and the low voltage supply rail.

In Example 13, the subject matter of one or any combination of Examples 1-12 can optionally be included in an integrated circuit.

Example 14 can include subject matter, or can optionally be combined with the subject matter of one or any combination of Examples 1-13 to include subject matter, (such as a method, a means for performing acts, or a machine-readable medium including instructions that, when performed by the machine, cause the machine to perform acts) comprising biasing an amplifier with a first bias current value, monitoring the output voltage of the amplifier, detecting that the output voltage exceeds a specified output voltage threshold value, and biasing the amplifier with a second bias current value when the output voltage exceeds a specified output voltage threshold value.

In Example 15, the biasing the amplifier with a second bias current value of Example 14 can optionally include biasing the amplifier with a second bias current value that is proportional to a measured change in the output voltage.

In Example 16, the biasing the amplifier of one or any combination of Examples 14 and 15 can optionally include generating the second bias current by increasing a ratio of mirrored current used to bias the output stage of the amplifier.

In Example 17, the biasing the amplifier of one or any combination of Examples 14-16 can optionally include mirroring a reference current to generate a bias current in the output stage, and increasing the reference current to increase the bias current in the output stage.

In Example 18, the biasing the amplifier of one or any combination of Examples 14-17 can optionally include biasing the amplifier with the second bias current value for a specified time duration when detecting that the output voltage exceeds the specified output voltage threshold value, detecting whether the output voltage exceeds the specified output voltage threshold value at the end of the time duration, and restarting the specified time duration when the output voltage exceeds the specified output voltage threshold value.

In Example 19, the subject matter of one or any combination of Examples 14-18 can optionally include increasing a difference between a high supply voltage and a low supply voltage of the amplifier when the output voltage exceeds a specified output voltage threshold value.

In Example 20, the subject matter of one or any combination of Examples 14-19 can optionally include generating an output signal using the output stage, wherein the output signal includes signal frequencies in the audio range. The biasing the amplifier with a first bias current can optionally include biasing the output stage of the amplifier to drive a load having an impedance that is less than one hundred ohms (100Ω), and the biasing the amplifier with a second bias current can optionally include increasing the bias current of the amplifier to reduce harmonic distortion of the output signal at the load.

Example 21 can include, or can optionally be combined with any portion or combination of any portions of any one or more of Examples 1-20 to include, subject matter that can include means for performing any one or more of the functions of Examples 1-20, or a machine-readable medium including instructions that, when performed by a machine, cause the machine to perform any one or more of the functions of Examples 1-20.

These non-limiting examples can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
   an amplifier circuit including a high voltage supply rail, a low voltage supply rail, and an output stage; and
   a detection circuit electrically coupled to the amplifier output stage and configured to generate an indication when an output voltage at the output stage exceeds a specified output voltage threshold value,
   wherein the amplifier circuit further includes a bias circuit configured to:
      bias the amplifier circuit with a first bias current value when the output voltage is less than the specified output voltage threshold value, wherein the first bias current value biases the amplifier circuit with a first amplifier gain; and
      bias the amplifier circuit with a second bias current value when the output voltage exceeds the specified output voltage threshold value, wherein the second bias current value biases the amplifier circuit with a second amplifier gain that is greater than the first amplifier gain,
   wherein the bias circuit includes a current reference circuit and a current mirror circuit configured to mirror a multiple of the referenced current in the output stage; and
   wherein the bias circuit is configured to increase the multiple of the referenced current in the output stage to generate the second bias current.

2. The apparatus of claim 1, wherein the bias circuit is configured to increase the multiple of the referenced current in the output stage in proportion to a measured output voltage at the output stage.

3. The apparatus of claim 1,
wherein the current mirror circuit includes a plurality of transistors including a first transistor to mirror the reference current at a circuit node of the output stage of the amplifier, and
wherein the current mirror circuit is configured to switch one or more additional transistors onto the circuit node to generate the second bias current.

4. An apparatus comprising:
an amplifier circuit including a high voltage supply rail, a low voltage supply rail, and an output stage; and
a detection circuit electrically coupled to the amplifier output stage and configured to generate an indication when an output voltage at the output stage exceeds a specified output voltage threshold value,
wherein the amplifier circuit further includes a bias circuit configured to:
bias the amplifier circuit with a first bias current value when the output voltage is less than the specified output voltage threshold value, wherein the first bias current value biases the amplifier circuit with a first amplifier gain; and
bias the amplifier circuit with a second bias current value when the output voltage exceeds the specified output voltage threshold value, wherein the second bias current value biases the amplifier circuit with a second amplifier gain that is greater than the first amplifier gain,
wherein the bias circuit includes a current reference circuit and a current mirror circuit configured to mirror a multiple of the referenced current in the output stage, and
wherein the bias circuit is configured to increase the referenced current to generate the second bias current.

5. The apparatus of claim 4, wherein the current reference circuit includes a plurality of current references including a first current reference and a second current reference, and wherein the current reference circuit is configured to:
provide a first reference current at a circuit node of the amplifier circuit to provide the first bias current when the output voltage is less than the specified output voltage threshold value, and
switch a second current reference to the circuit node of the amplifier circuit to generate the second bias current when the output voltage exceeds the specified output voltage threshold value.

6. The apparatus of claim 1, including:
a timer circuit electrically coupled to the detection circuit, wherein the timer circuit is configured to time a specified time duration when receiving the indication from the detection circuit; and
a logic circuit configured to:
enable biasing of the amplifier circuit with the second bias current for the specified time duration;
enable biasing of the amplifier circuit with the first bias current when the output voltage is less than the specified output voltage threshold value at the end of the time duration; and
reset the timer circuit to again time the specified time duration and enable biasing of the amplifier circuit with the second bias current when the output voltage exceeds the specified output voltage threshold value at the end of the time duration.

7. The apparatus of claim 1, including
a timer circuit electrically coupled to the detection circuit, wherein the timer circuit is configured to time a specified time duration when the output voltage exceeds the specified output voltage threshold value, and wherein the specified output voltage threshold voltage value is a first specified output voltage threshold value; and
a logic circuit configured to:
enable biasing of the amplifier circuit with the second bias current for the specified time duration;
enable biasing of the amplifier circuit with the first bias current when the output voltage is less than a second specified output voltage threshold value at the end of the time duration, wherein the second specified output voltage threshold value is less than the first specified output voltage threshold value; and
reset the timer circuit to again time the specified time duration and enable biasing of the amplifier circuit with the second bias current when the output voltage exceeds the second specified output voltage threshold value at the end of the time duration.

8. The apparatus of claim 1, including a voltage converter circuit electrically coupled to the high voltage supply rail and configured to generate the high supply voltage, wherein the voltage converter circuit is configured to increase a difference between the high supply voltage rail and the low supply voltage rail of the amplifier circuit when the output voltage exceeds a specified output voltage threshold value.

9. The apparatus of claim 8, including a charge pump circuit electrically coupled to the low voltage supply, wherein the charge pump circuit is configured to invert the high supply voltage to generate the low supply voltage, and
wherein the voltage converter circuit is configured to increase the high supply voltage when the output voltage exceeds the specified output voltage threshold value.

10. The apparatus of claim 1, wherein the detection circuit includes a comparator circuit configured to provide the indication when the output voltage exceeds a specified reference voltage.

11. The apparatus of claim 1, wherein the detection circuit includes a comparator circuit configured to provide the indication when the output voltage exceeds a specified percentage of the voltage difference between the high voltage supply rail and the low voltage supply rail.

12. The apparatus of claim 1, wherein the apparatus is included in an integrated circuit.

13. A method comprising:
biasing an amplifier with a first bias current value, wherein the first bias current value biases the amplifier circuit with a first amplifier gain;
monitoring the output voltage of the amplifier;
detecting that the output voltage exceeds a specified output voltage threshold value; and
biasing the amplifier with a second bias current value when the output voltage exceeds a specified output voltage threshold value, wherein the second bias current value biases the amplifier circuit with a second amplifier gain that is greater than the first amplifier gain, and
wherein biasing the amplifier includes generating the second bias current by increasing a ratio of mirrored current used to bias the output stage of the amplifier.

14. The method of claim 13, wherein biasing the amplifier with a second bias current value includes biasing the amplifier with a second bias current value that is proportional to a measured change in the output voltage.

15. The method of claim 13, wherein biasing the amplifier includes:
biasing the amplifier with the second bias current value for a specified time duration when detecting that the output voltage exceeds the specified output voltage threshold value;

detecting whether the output voltage exceeds the specified output voltage threshold value at the end of the time duration; and restarting the specified time duration when the output voltage exceeds the specified output voltage threshold value.

16. The method of claim 13, including increasing a difference between a high supply voltage and a low supply voltage of the amplifier when the output voltage exceeds the specified output voltage threshold value.

17. The method of claim 13, including:
generating an output signal using the output stage, wherein the output signal includes signal frequencies in the audio range,
wherein biasing the amplifier with a first bias current includes biasing the output stage of the amplifier to drive a load having an impedance that is less than one hundred ohms (100Ω), and
wherein biasing the amplifier with a second bias current includes increasing the bias current of the amplifier to reduce harmonic distortion of the output signal at the load.

18. A method comprising:
biasing an amplifier with a first bias current value, wherein the first bias current value biases the amplifier circuit with a first amplifier gain, wherein biasing the amplifier includes:
mirroring a reference current to generate a bias current in the output stage, and
increasing the reference current to increase the bias current in the output stage;
monitoring the output voltage of the amplifier;
detecting that the output voltage exceeds a specified output voltage threshold value; and
biasing the amplifier with a second bias current value when the output voltage exceeds a specified output voltage threshold value, wherein the second bias current value biases the amplifier circuit with a second amplifier gain that is greater than the first amplifier gain.

* * * * *